United States Patent [19]

Leupold

[11] Patent Number: 4,835,506
[45] Date of Patent: May 30, 1989

[54] HOLLOW SUBSTANTIALLY HEMISPHERICAL PERMANENT MAGNET HIGH-FIELD FLUX SOURCE

[75] Inventor: Herbert A. Leupold, Eatontown, N.J.

[73] Assignee: The United States of America as represented by the Secretary of the Army, Washington, D.C.

[21] Appl. No.: 199,504

[22] Filed: May 27, 1988

[51] Int. Cl.$^4$ ................................................ H01F 7/02
[52] U.S. Cl. .................................. 335/306; 315/5.35; 335/304
[58] Field of Search ............... 335/212, 302, 304, 306; 315/5.24, 5.34, 5.35

[56] References Cited

U.S. PATENT DOCUMENTS

| | | | |
|---|---|---|---|
| 2,952,803 | 9/1960 | Charles et al. | 335/302 |
| 3,768,054 | 10/1973 | Neugebauer | 335/306 X |
| 4,392,078 | 7/1983 | Noble et al. | 315/5.35 X |
| 4,429,229 | 1/1984 | Gluckstern | 335/212 X |
| 4,614,930 | 9/1986 | Hickey et al. | 335/306 X |

OTHER PUBLICATIONS

"Proceedings of the Eighth International Workshop on Rare Cobalt Permanent Magnets", by Klaus Halbach (Univ. Dayton, Dayton, OH, 1985), pp. 123–136.

Primary Examiner—George Harris
Attorney, Agent, or Firm—Sheldon Kanars; John K. Mullarney

[57] ABSTRACT

A hollow hemispherical flux source produces a uniform high-field in its central cavity. The hemisphere is comprised of a selected magnetic material whose magnetization is azimuthally symmetrical. The magnetic orientation ($\alpha$) in the hemispherical permanent magnet shell is given by the equation:

$$\alpha = 2\theta$$

where $\theta$ is the polar angle. A planar plate of high saturation, high permeability material closes the open end of the hemisphere. An axial bore hole through the hemisphere and/or through the planar plate provides the requisite accessability.

11 Claims, 5 Drawing Sheets

HOLLOW SUBSTANTIALLY HEMISPHERICAL PERMANENT MAGNET HIGH-FIELD FLUX SOURCE

The invention described herein may be manufactured, used and licensed by or for the Government for governmental purposes without the payment to me of any royalties thereon.

TECHNICAL FIELD

The present invention relates in general to permanent-magnet structures for use in electronic devices and, more particularly, to hollow, substantially hemispherical, flux sources which produce uniform magnetic fields greater than the remanence of the magnetic material comprising them.

BACKGROUND OF THE INVENTION

Many devices that employ magnetic fields have heretofore been encumbered by massive solenoids with their equally bulky power supplies. Thus, there has been increasing interest in the application of permanent-magnet structures for such uses as electron-beam focusing and biasing fields. The current demand for compact, strong, static magnetic field sources that require no electric power supplies has created needs for permanent magnet structures of unusual form. A number of configurations have been designed and developed for electron-beam guidance in mm/microwave tubes of various types; for dc biasing fields in millimeter wave filters, circulators, isolators, strip-lines; for field sources in NMR (nuclear magnetic resonance) imagers; and so on. Especially promising for such purposes is the configuration based on the hollow cylindrical flux source (HCFS) principle described by K. Halbach, in "Proceedings of the Eighth International Workshop on Rare Earth Cobalt Permanent Magnets" (University of Dayton, Dayton, OH, 1985) pp. 123-136. A HCFS, sometimes called a "magic ring," is a cylindrical permanent-magnet shell which offers a magnetization vector that is more-or-less constant in magnitude and produces a field greater than the remanence of the magnetic material from which it is made.

The "magic ring" or HCFS concept has proven to be useful for a variety of applications that require relatively high transverse fields in tubular working spaces (e.g., mm/microwave radiation sources and amplifiers). Unfortunately, there are field distortions in the magic ring due to end effects, and to achieve a fairly uniform biasing field the device would have to be wastefully long (i.e., a very large length-to-radius ratio). And, the length necessary to achieve a highly uniform biasing a field requires a fairly massive structure.

In the co-pending patent application of the present inventor, Ser. No. 199,500, filed 5/27/88, there is disclosed a hollow spherical flux source(s) which achieves a strong, uniform biasing field within a very compact structure. Also, the uniform high-field is undistorted and greater than that produced by a magic ring of the same radius. Since it is not feasible to construct an ideal hollow spherical flux source (HSFS) or "magic sphere," in practice a segmented approximation is utilized.

SUMMARY OF THE INVENTION

In accordance with the present invention, a strong magnetic field equal to that of a magic sphere is more readily and cheaply arrived at. The follow hemispherical flux source (HHFS) or "magic igloo" of the invention comprises half a magic sphere (e.g., the northern hemisphere) placed on a planar sheet of high saturation, high permeability material. The magnetic "anti-mirror" image of the hemispheric structure in the permeable plane makes the hemispheric central cavity appear (magnetically) exactly as if a complete magic sphere were its source. The central or working cavity is readily accessed through an axial hole in the planar material. For some applications, an axial bore hole through the hemispheric magnetic shell is also necessary. A segmented hemisphere is, of course, easier and cheaper to make than a segmented sphere.

BRIEF DESCRIPTION OF THE DRAWINGS

The invention will be more fully appreciated from the following detailed description when the same is considered in connection with the accompanying drawings in which.

DETAILED DESCRIPTION

Figure 1:
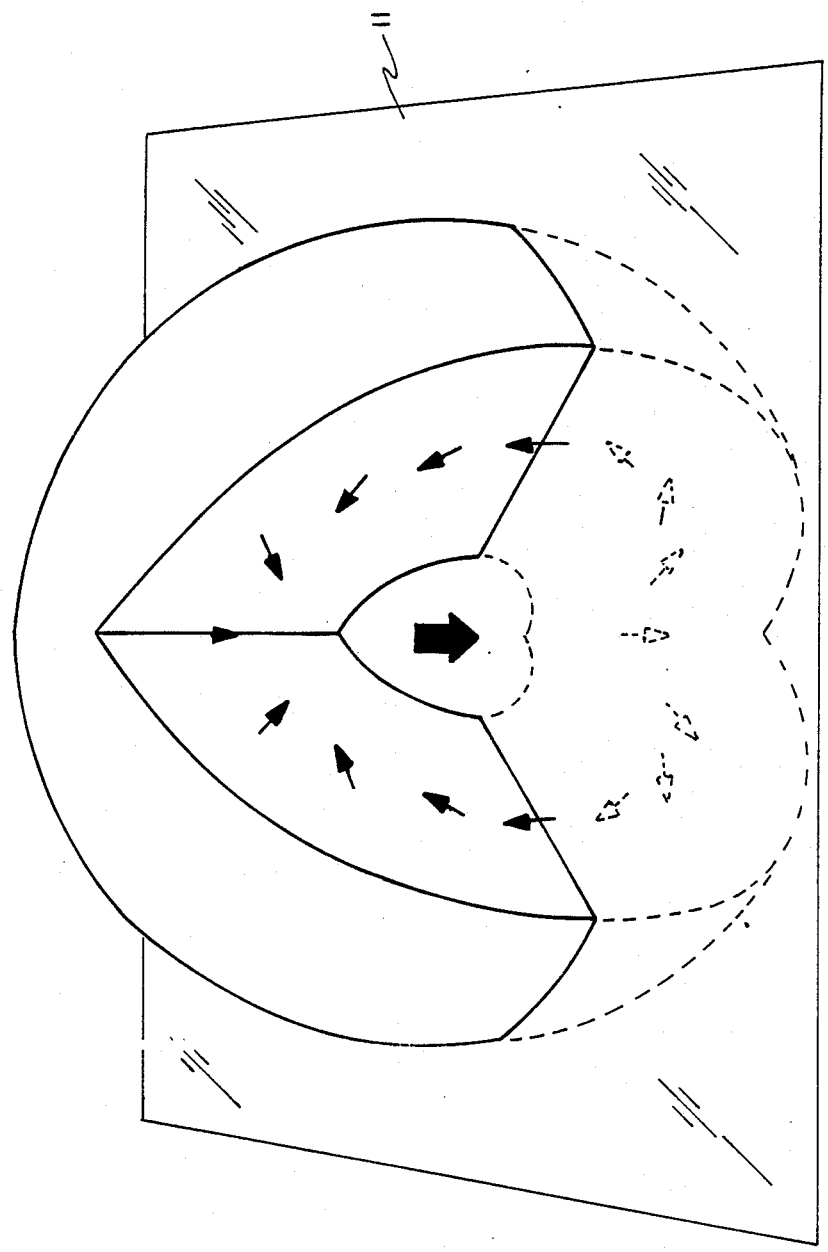
FIG. 1 shows a partially cut-away, ideal hollow hemispherical flux source.

FIG. 1 illustrates an ideal, hollow hemispherical flux source (HHFS) or "magic igloo" in accordance with the present invention. The HHFS (half a magic sphere) is placed on a planar sheet of high saturation, high permeability material 11 (e.g., one of the soft ferromagnets). The large arrow in FIG. 1 designates the uniform high-field in the central cavity, the latter being a hemispherical hole. The hollow hemisphere is comprised of magnetic material and its magnetization is azimuthally symmetrical. The small solid arrows in FIG. 1 indicate the magnetization orientation ($\alpha$) at various points. The magnetic orientation in the hemispherical permanent magnet shell is given by the equation:

$$\alpha = 2\theta,$$

where $\theta$ is the polar angle. The value $\alpha$ is the magnetization angle with respect to the polar axis. The paramagnetic or anti-mirror image in permeable plane 11 is illustrated in dashed lines and small dashed arrows. The anti-mirror image completes the magic sphere—i.e., the hemispheric central cavity appears (magnetically) exactly as if a complete magic sphere were its source. The term "magnetic anti-mirror" means a magnetic "mirror" that reverses or inverts the magnetic image. Stated somewhat differently, a magnetic anti-mirror forms a virtual inverted magnetic image of a given pole distribution. The sheet 11 of permeable material is magnetically passive (i.e., it has no permanent magnetic moment).

The field (H) in the hemispherical central cavity is given by:

$$H = (4/3) B_r ln(r_o/r_i),$$

where $B_r$ is the remanence of the magnetic material and $r_o$ and $r_i$ are, respectively, the outer and inner radii of the hemisphere.

Figure 2:
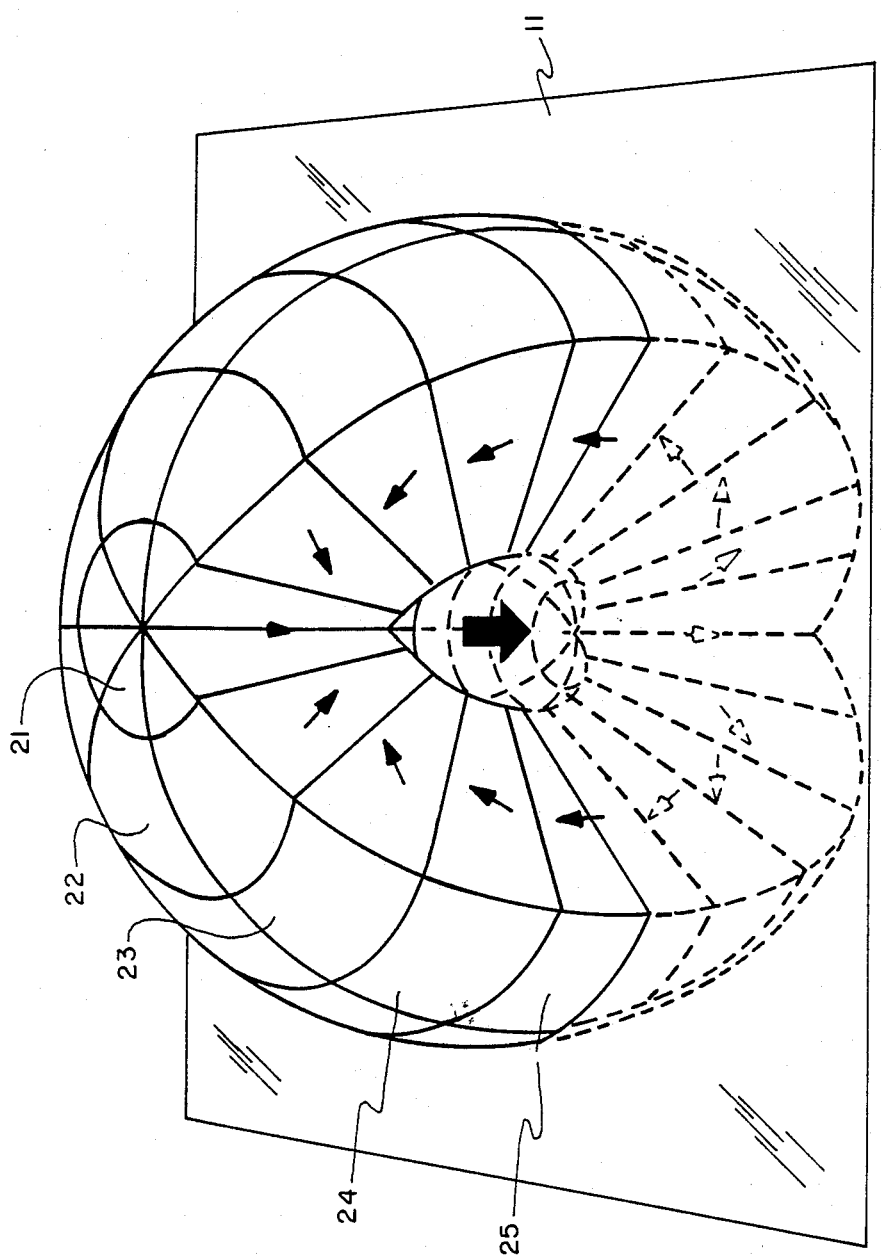
FIG. 2 shows a partially cut-away, practicable approximation to the ideal structure shown in FIG. 1.

Since it is not feasible to construct an ideal HHFS, in practice, a segmented approximation such as that shown in FIG. 2 is used. In such a configuration the magnetization is constant in both amplitude and direction within any one segment. Fortunately, even with as few as eight segments per great circle of longitude, more than 90 percent of the field of the ideal structure is obtainable. This greatly facilitates construction of a practical device and reduces costs considerably. Azimuthal field dependence is assumed to be continuous.

Considering FIG. 2 now in greater detail, the hollow magnetic hemisphere is comprised of a series of cones 21–25. The polar cone 21 is solid, whereas the series of juxtaposed cones 22–25 have the appearance of conical shells. Considering cone 22, by way of example, it is readily seen to be conical shell whose outer and inner surfaces are both cones. While the hemisphere depicted in FIG. 2 is shown to comprise five cones, the invention is not so limited and the hemisphere might comprise a fewer or a larger number of cones. The greater the number of cones the closer the approximation to the ideal case.

Each of the cones 21–25 is segmented along distinct lines of longitudinal meridian(s), as depicted in FIG. 2. It will be evident from FIG. 2 that the cones 21 and 22, for example, are each comprised of eight segments (two segments of cones 21 and 22 are not shown due to the partial cut-away). Once again, however, while the cones 21–25 may each be segmented into eight segments, the invention is not so limited and the cones might comprise a fewer or a larger number of segments; the greater the number of segments the closer the approximation to the ideal case.

If a field of 20 kOe is desired in a hemispheric central cavity of 2.0 cm radius, and if the magnetic material has a remanence of 12 kG, a shell thickness of about 4 cm is needed. The magnetic mass will be about 2 kg., a small mass for so great a field in that volume. A permeable plate (e.g., iron) of at least 1 cm in thickness is desirable.

Figure 3:
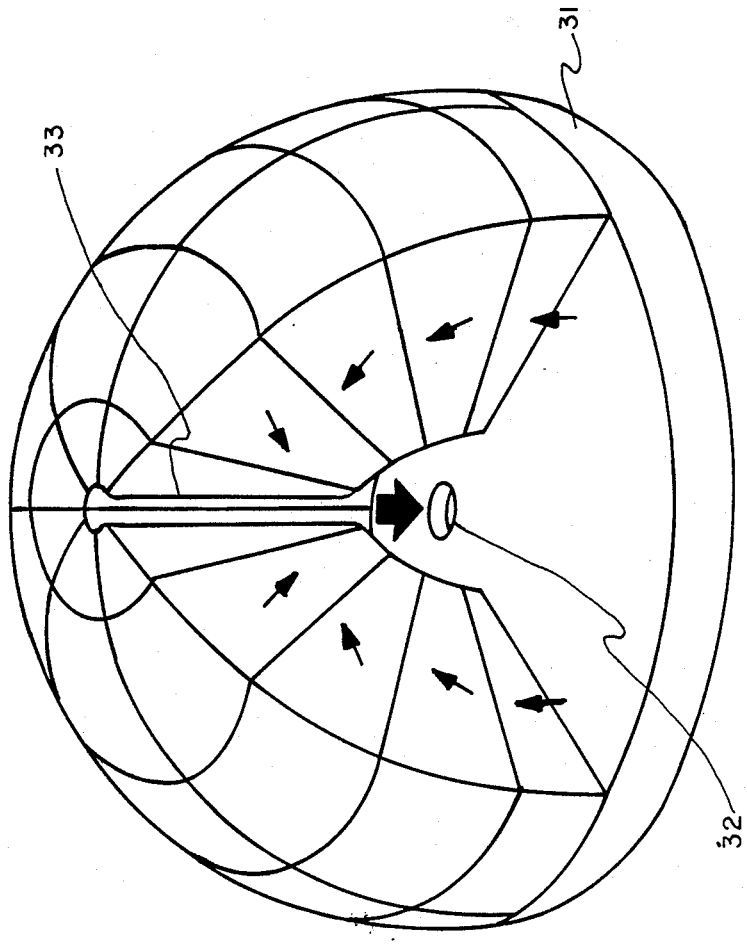
FIG. 3 illustrates a partially cut-away, practicable embodiment of the FIG. 2 structure.

FIG. 3 shows a practicable embodiment of the FIG. 2 magic igloo; the segmented hemispherical flux source of FIG. 3 is essentially the same as that of FIG. 2. When a disc-shaped plate 31 is used to close the open end, no flux will leak to the outside. Thus, the structure will not be attracted to iron or other magnetic material(s) that may be encountered, for example, while it is being transported. For the field in the central cavity to be useful, accessibility to electrical leads and/or other conduits is necessary. To this end, an axial bore hole 32 can be drilled through the permeable plate 31 without marring the expensive magnetic structure. Given just the hole through the plate 31, the structure of FIG. 3 could be used, for example, to conduct a laboratory experiment in which one could measure the Hall effect of a semiconductor material disposed in the hemispheric cavity; the hole provides the access for electrical leads. Other and different uses will occur to those skilled in the art. For other applications (e.g., traveling wave tubes) a tunnel or axial bore hole 33 through the hemispherical magnetic shell is also necessary. The bore hole 33 is aligned with the hole 32.

Figure 4:
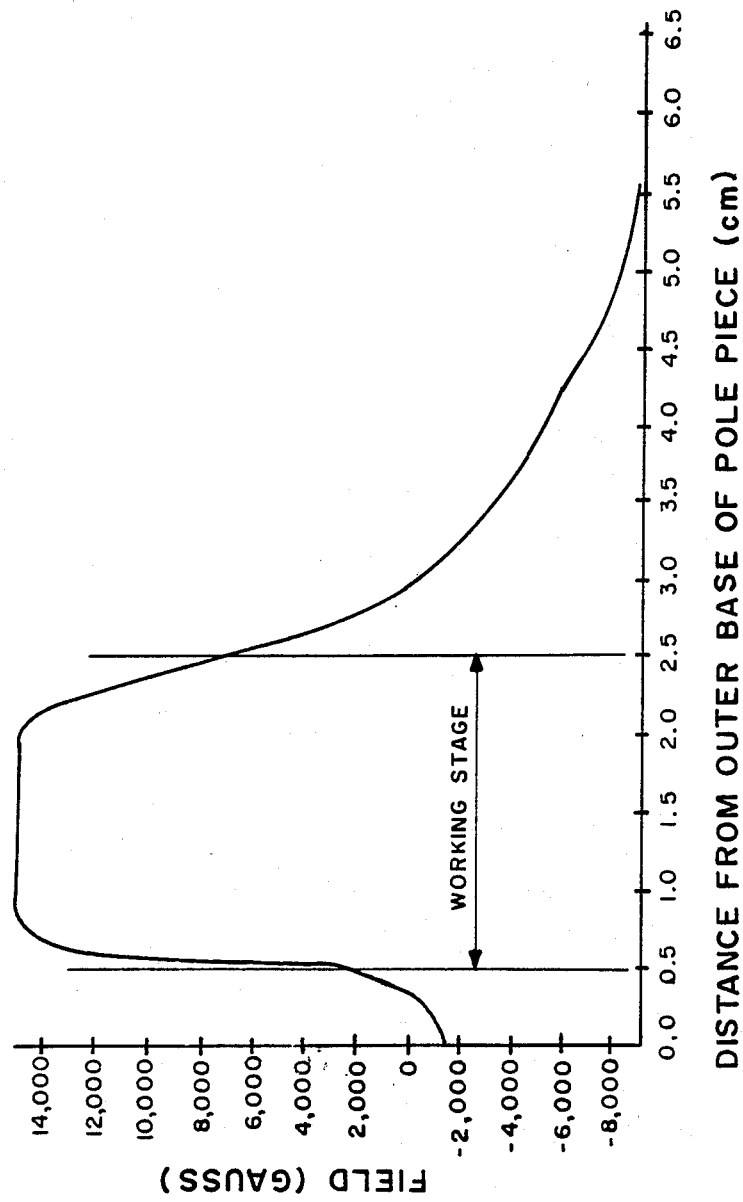
FIG. 4 is a graph useful in illustrating an advantageous aspect of the invention.

FIG. 4 shows the on-axis field of HHFS or magic igloo. The spherical shell thickness is 4 cm, the inner radius is 2cm, and the magnetic remanence is 12 kG. The holes (through both the pole piece and shell) were varied from 2 to 10 mm hole diameter and substantially the same curve shown in FIG. 4 was obtained in each case. It was found that the magic igloo is very forgiving with regard to axial holes, which can be up to one-fourth the diameter of the central cavity. The only effect of increasing hole size appears to be a slight additional rounding of the initial flat field profile. Accordingly, admittance of conduits of any size likely to be needed for a given cavity diameter can be provided with very little field loss. As evident from FIG. 4, the magic igloo provides a uniform high-field over a major portion of the central cavity.

Figure 5:
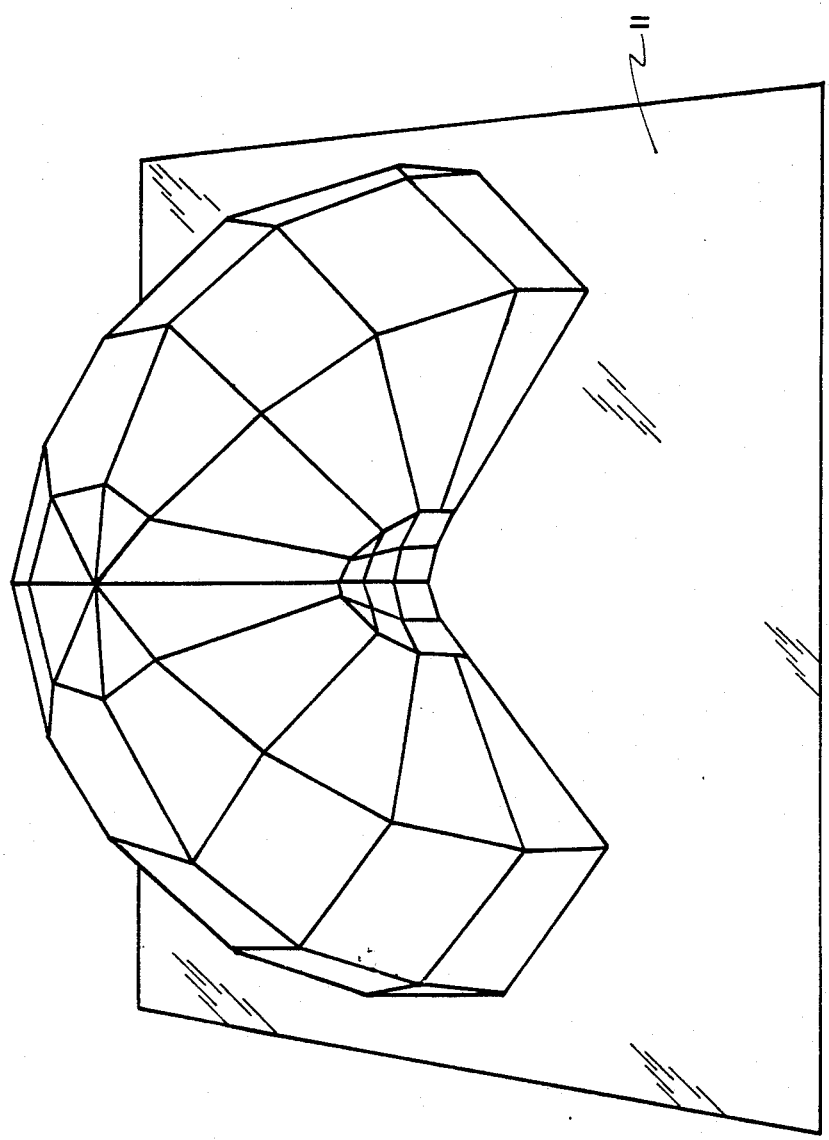
FIG. 5 shows a partially cut-away polyhedron, which is a further approximation to the ideal structure of FIG. 1.

FIG. 5 shows a substantially hemispherical flux source in the form of a polyhedron. The flux source or magic igloo of FIG. 5 corresponds to that of FIG. 2 except the inner and outer surfaces of each segment are flat or planar. The performance of the FIG. 5 structure is closely equivalent to that of FIGS. 2/3, the latter being depicted in FIG. 4. The greater the number of facets of the polyhedron the closer the approximation to the ideal case.

The magnetic material of the segments of the magic hemisphere(s) may be composed of $Nd_2Fe_{14}B$, $SmCo_5$, $PtCo_5$, $Sm_2(CoT)_{17}$ where T is one of the transition metals, and so on. The foregoing materials are characterized by the fact that they maintain their full magnetization to fields larger than their coercivities. These and other equivalent magnetic materials (e.g., selected ferrites) are known to those in the art. Accordingly, it is to be understood that the principles of the present invention are in no way limited to the magnetic material selected for the segments. Also, as known to those skilled in the art, the segments can be pressed to the appropriate shape(s) and magnetized in the desired orientation using any of the known magnetization techniques.

The high saturation, high permeability planar sheet (e.g., numerals 11/31) may be comprised of iron, permandur, permalloy, etc. As is known to those skilled in the art, the plate must be thick enough to prevent saturation of the plate material. Stated somewhat differently, the flux in the cavity must not exceed an amount that will result in a value of B (flux density) in the anti-mirror material that is greater than its saturation value. Thus, there is an interrelationship between the desired cavity field and the plate thickness. For a field of about 20 kOe a plate of iron should be at least 1 cm in thickness; for permandur a plate thickness of about 0.8 cm will suffice.

It is, of course, easier and cheaper to make half a magic sphere than a whole one. Also, if only a single access hole is required, a magic igloo with a hole through its planar sheet is preferable. Portability is also of great appeal for the magic igloo; with an object smaller than half a grapefruit, over 20 kOe is available in a hemispherical space about an inch in diameter.

Other and different approximations to the ideal, hollow hemispherical flux source may occur to those skilled in the art. Accordingly, having shown and described what is at present considered to be several preferred embodiments of the invention, it should be understood that the same has been shown by way of illustration and not limitation. And, all modifications, alterations and changes coming within the spirit and scope of the invention are herein meant to be included herein.

What is claimed is:

1. A permanent magnet structure comprising a hollow substantially hemispherical magnetic flux source for producing a substantially uniform high-field in its central cavity, said hemispherical flux source being azimuthally symmetrical in magnetization, the magnetic orientation ($\alpha$) in the substantially hemispherical magnetic shell being given by the equation $\alpha=2\theta$, where $\theta$ is the polar angle, and a planar plate of high saturation, high permeability material upon which said hemispherical flux source is placed so that said plate closes the open end thereof.

2. A permanent magnet structure as defined in claim 1 wherein said central cavity is substantially hemispherical.

3. A permanent magnet structure as defined in claim 2 wherein said planar plate has an axial bore hole therethrough.

4. A permanent magnet structure as defined in claim 3 wherein said hemispherical flux source has an axial bore hole therethrough which is aligned with the bore hole through said polar plate.

5. A permanent magnet structure as defined in claim 4 wherein said bore holes are of substantially the same diameter.

6. A permanent magnet structure as defined in claim 5 wherein said planar plate comprises a disc-shaped plate coextensive with the open end of said hemispherical flux source.

7. A permanent magnet structure as defined in claim 6 wherein said bore holes are of a diameter up to one-fourth the diameter of said central cavity.

8. A permanent magnet structure as defined in claim 7 wherein the substantially hemispherical magnetic shell is comprised of a plurality of juxtaposed conical sections, each conical section being segmented along a plurality of distinct lines of longitudinal meridians.

9. A permanent magnet structure as defined in claim 8 wherein the field (H) in said central cavity is given by:

$$H=(4/3)B_r ln(r_o/r_i)$$

where $B_r$ is the remanence of the magnetic material and $r_o$ and $r_i$ are, respectively, the outer and inner radii of the hemisphere.

10. A permanent magnet structure as defined in claim 9 wherein said permeable plate is comprised of a selected soft ferromagnetic material.

11. A permanent magnet structure as defined in claim 10 wherein said substantially hemispherical flux source is in the form of a polyhedron having a multiplicity of facets.

* * * * *